(12) United States Patent
Kang et al.

(10) Patent No.: US 8,110,914 B2
(45) Date of Patent: Feb. 7, 2012

(54) WAFER LEVEL PACKAGE WITH REMOVABLE CHIP PROTECTING LAYER

(75) Inventors: Joon Seok Kang, Suwon-si (KR); Sung Yi, Suwon-si (KR); Young Do Kweon, Seoul (KR)

(73) Assignee: Samsung Electro-Mechanics Co., Ltd., Suwon (KR)

(*) Notice: Subject to any disclaimer, the term of this patent is extended or adjusted under 35 U.S.C. 154(b) by 267 days.

(21) Appl. No.: 12/318,752

(22) Filed: Jan. 7, 2009

(65) Prior Publication Data

US 2010/0133680 A1 Jun. 3, 2010

(30) Foreign Application Priority Data

Dec. 3, 2008 (KR) .......................... 10-2008-0121660

(51) Int. Cl.
*H01L 23/498* (2006.01)
*H01L 21/78* (2006.01)

(52) U.S. Cl. ......... 257/692; 257/E23.069; 257/E21.599; 257/700; 257/701; 257/784; 257/786

(58) Field of Classification Search ................. 257/692, 257/E23.069, E21.599, 701, 700, 784, 786; 438/113

See application file for complete search history.

(56) References Cited

U.S. PATENT DOCUMENTS

| | | | |
|---|---|---|---|
| 4,994,346 A * | 2/1991 | Meier et al. ................ | 430/280.1 |
| 6,605,413 B1 * | 8/2003 | Lyons et al. ................ | 430/314 |
| 6,808,865 B1 * | 10/2004 | Morigaki et al. ........... | 430/280.1 |
| 7,468,545 B2 * | 12/2008 | Lin et al. ..................... | 257/622 |
| 7,767,496 B2 * | 8/2010 | Shim et al. .................. | 438/118 |
| 2006/0160027 A1 * | 7/2006 | Niwa et al. .................. | 430/312 |
| 2008/0020511 A1 * | 1/2008 | Yang et al. .................. | 438/110 |
| 2008/0217761 A1 * | 9/2008 | Yang et al. .................. | 257/700 |
| 2008/0248614 A1 * | 10/2008 | Yang et al. .................. | 438/118 |
| 2009/0096098 A1 * | 4/2009 | Yang et al. .................. | 257/738 |
| 2009/0224391 A1 * | 9/2009 | Lin et al. ..................... | 257/690 |
| 2009/0309212 A1 * | 12/2009 | Shim et al. .................. | 257/700 |
| 2009/0321915 A1 * | 12/2009 | Hu et al. ..................... | 257/690 |
| 2010/0007017 A1 * | 1/2010 | Wei et al. .................... | 257/737 |
| 2010/0301474 A1 * | 12/2010 | Yang ........................... | 257/737 |

FOREIGN PATENT DOCUMENTS

KR 10-2008-0066248 7/2008

* cited by examiner

*Primary Examiner* — A O Williams

(57) ABSTRACT

A wafer level package includes a chip, a removable resin layer, a molding material, a dielectric layer, redistribution lines and a solder resist. The removable resin layer is formed to surround side surfaces and a lower surface of the chip. The molding material is formed on the lower surface of the removable resin layer. The dielectric layer is formed over the removable resin layer including the chip and having via holes to expose portions of the chip. The redistribution lines are formed on the dielectric layer including insides of the via holes to be connected to the chip. The solder resist layer is formed on the dielectric layer to expose portions of the redistribution lines.

4 Claims, 7 Drawing Sheets

[FIG. 1]
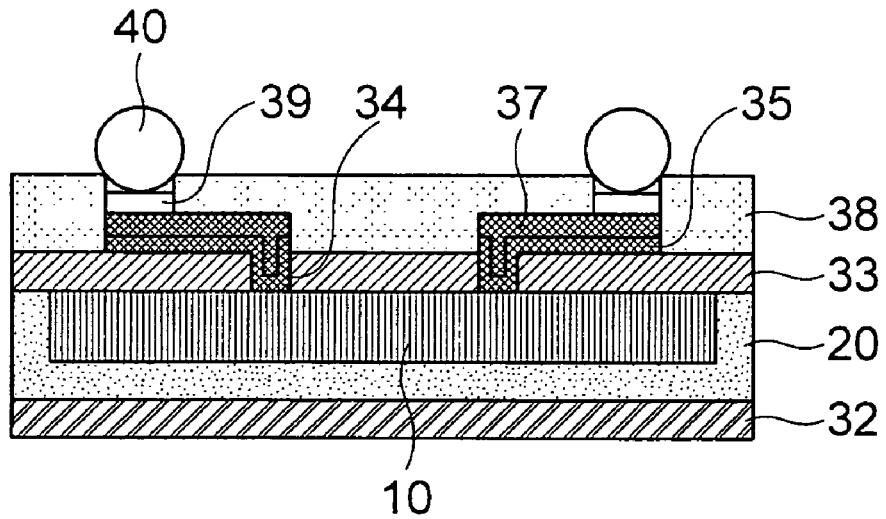
[FIG. 2]
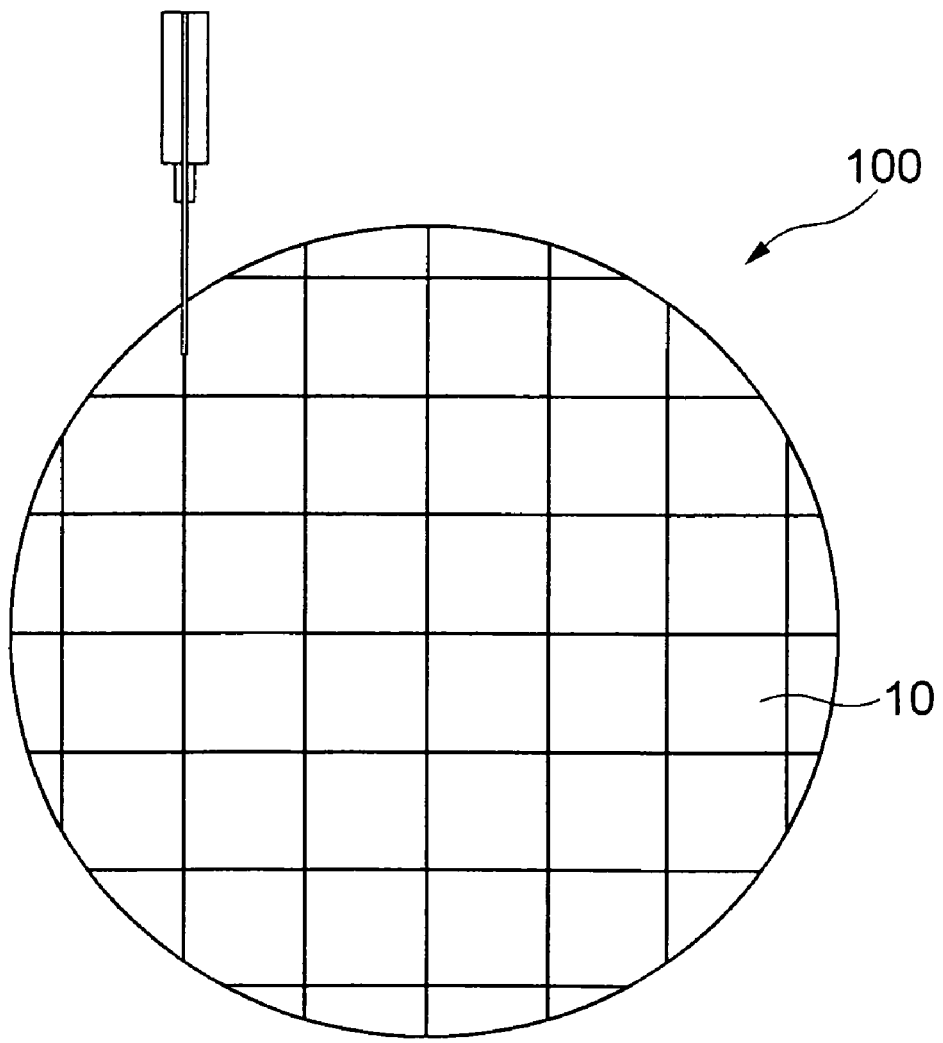

[FIG. 3]
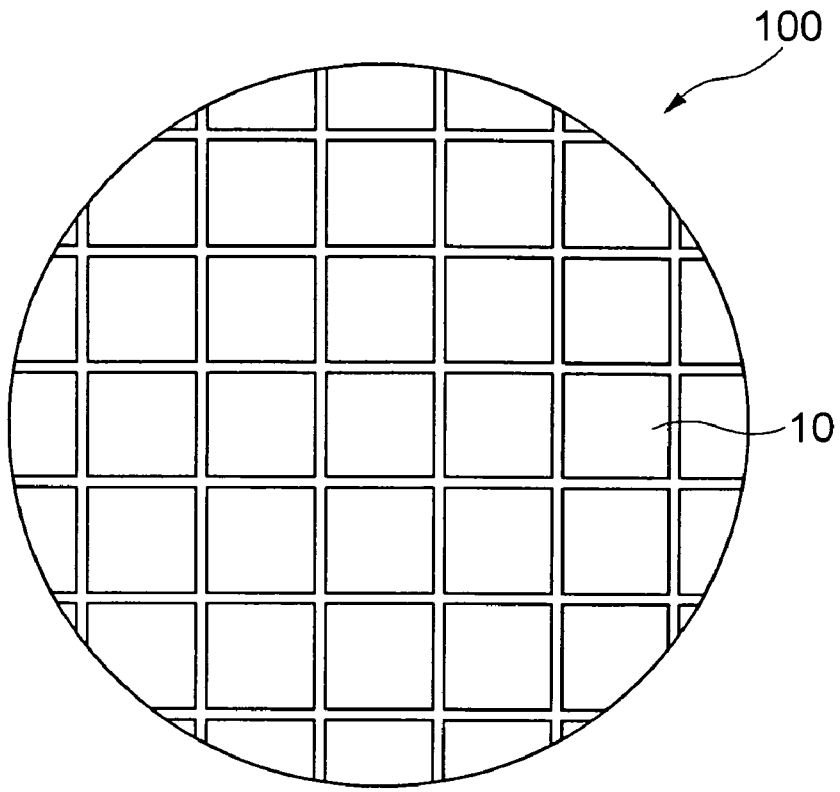
[FIG. 4]
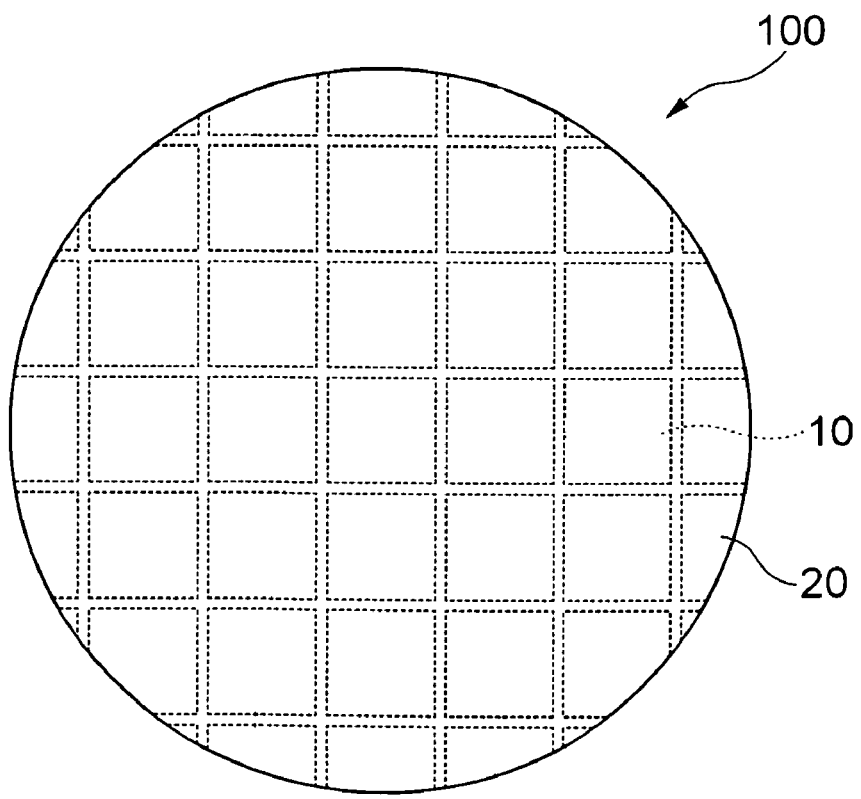

[FIG. 5]
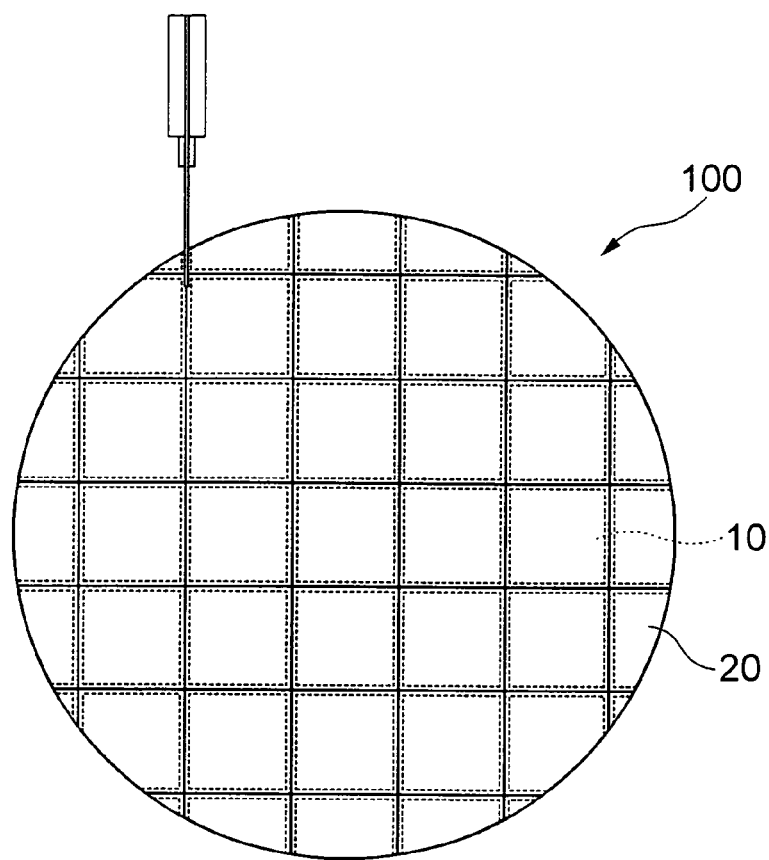
[FIG. 6]
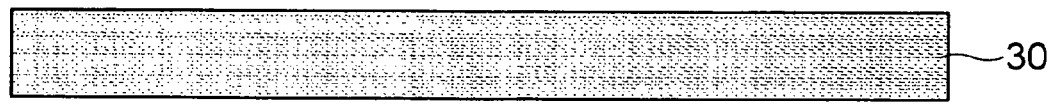
[FIG. 7]
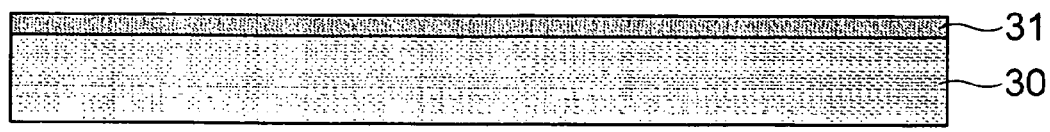

[FIG. 8]
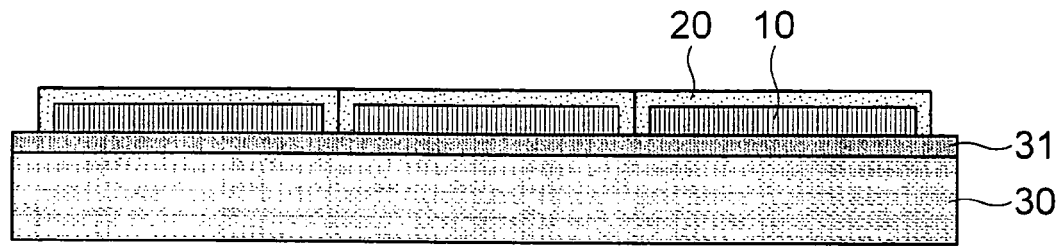
[FIG. 9]
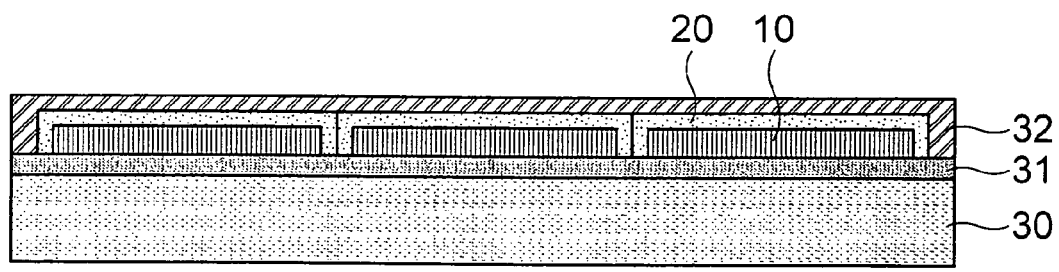
[FIG. 10]
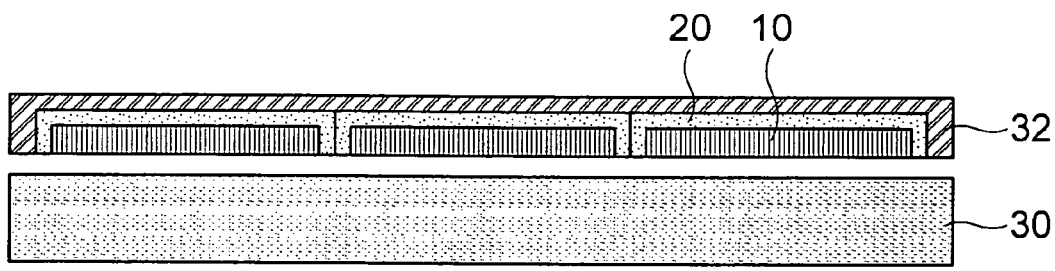
[FIG. 11]
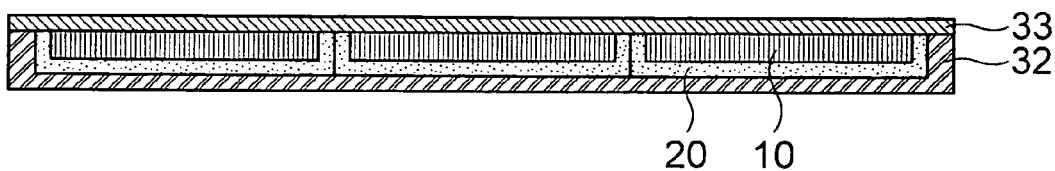
[FIG. 12]
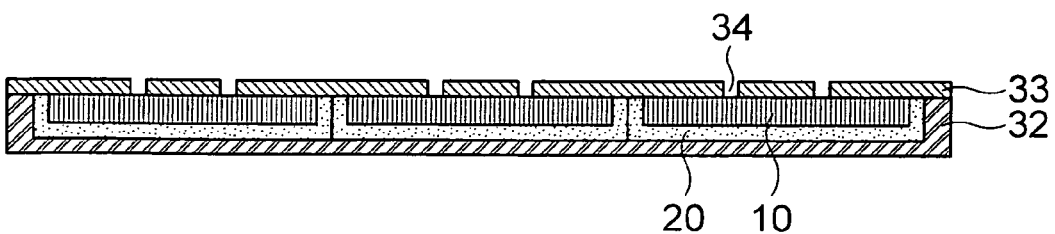

[FIG. 13]
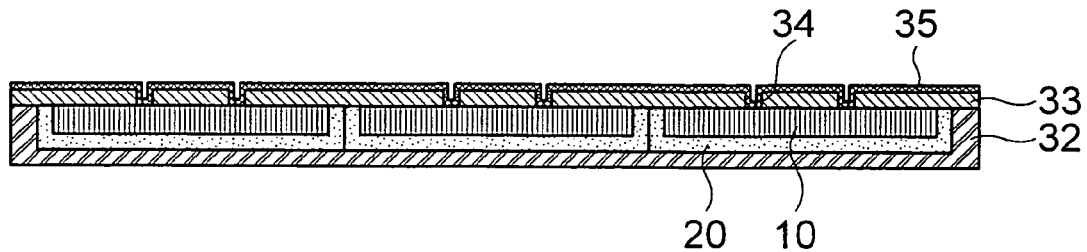
[FIG. 14]
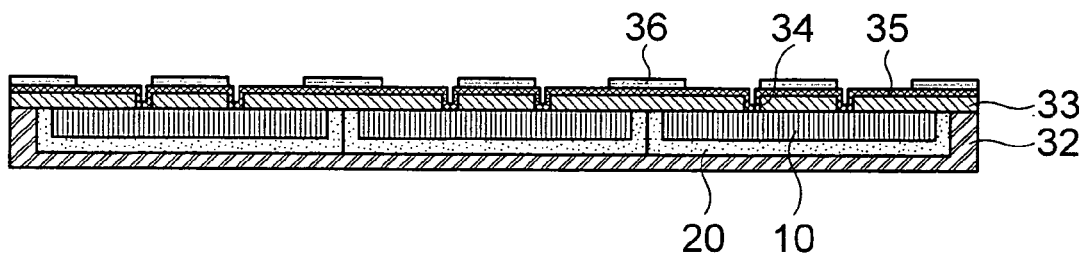
[FIG. 15]
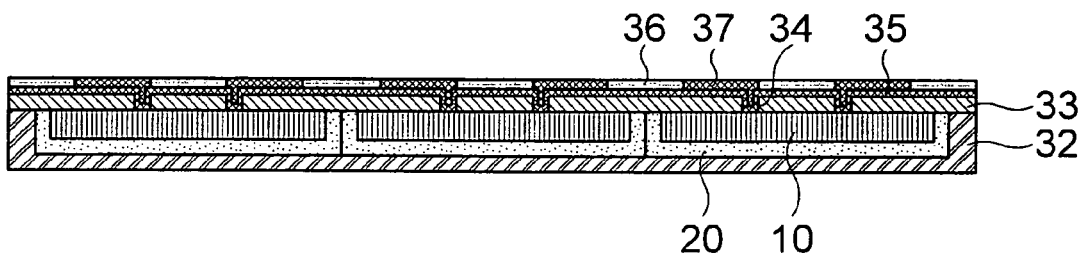
[FIG. 16]
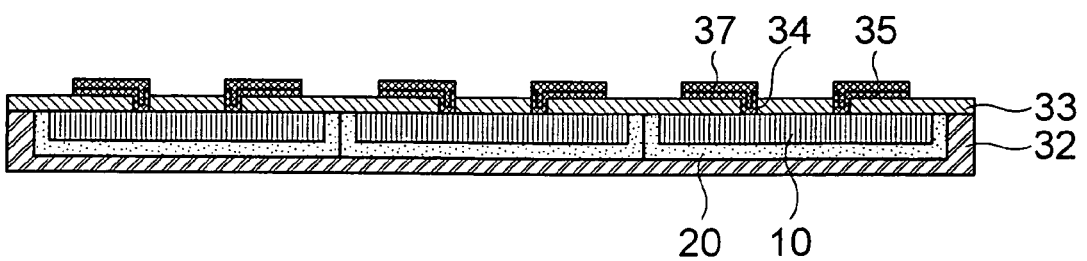
[FIG. 17]
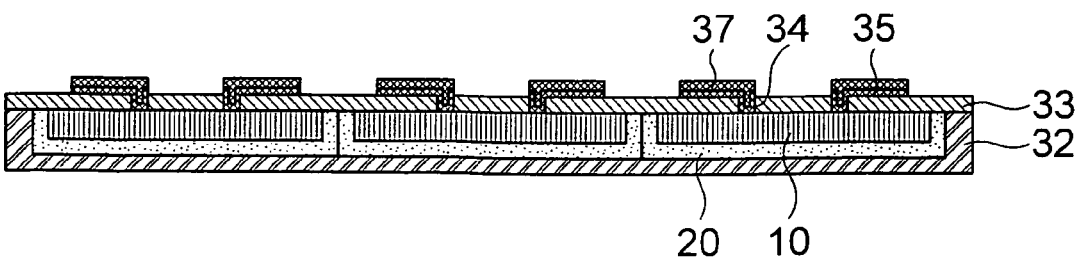

[FIG. 18]
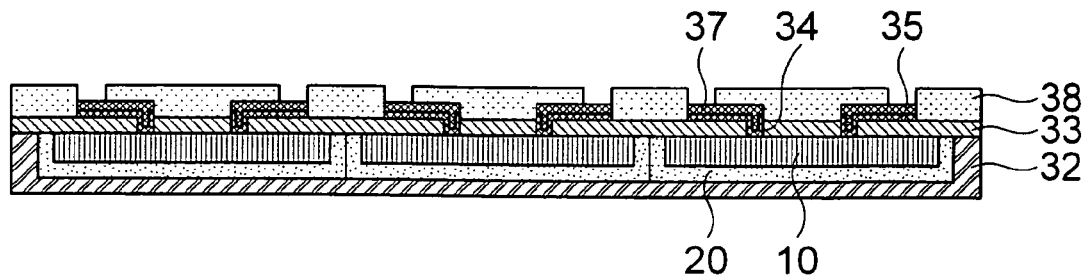
[FIG. 19]
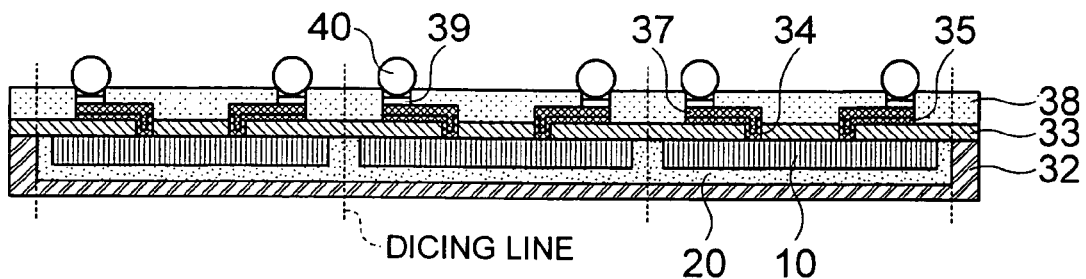
[FIG. 20]
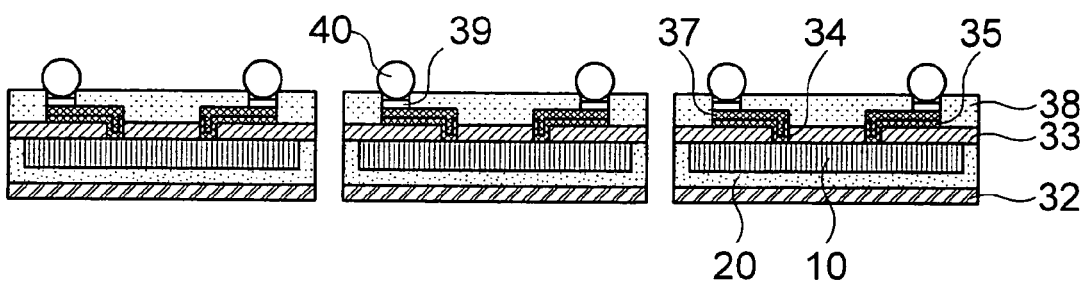
[FIG. 21]
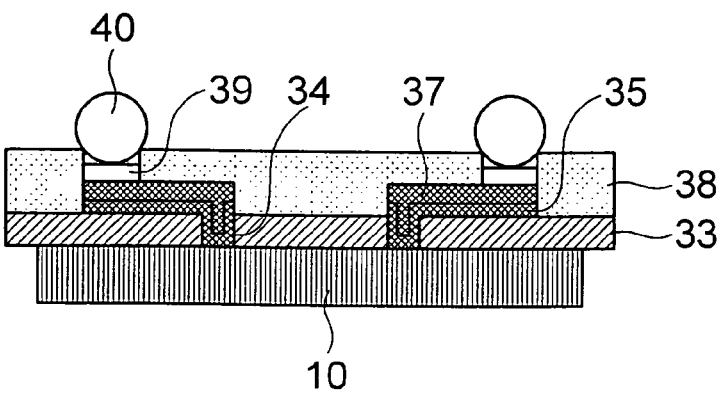

[FIG. 22]
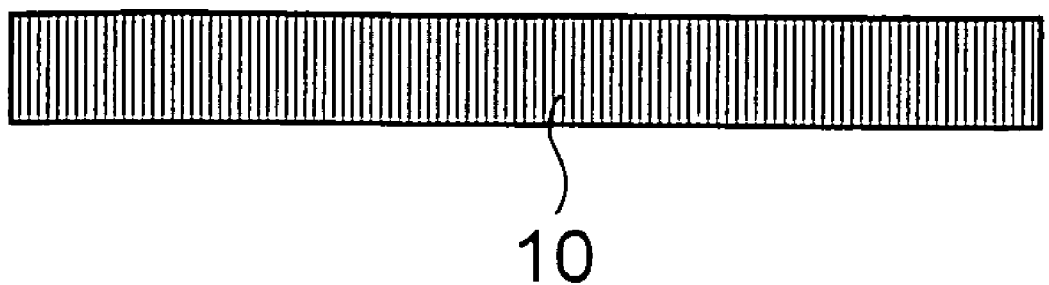

WAFER LEVEL PACKAGE WITH REMOVABLE CHIP PROTECTING LAYER

CROSS-REFERENCE TO RELATED APPLICATIONS

This application claims the benefit of Korean Patent Application No. 10-2008-0121660 filed with the Korea Intellectual Property Office on Dec. 3, 2008, the disclosure of which is incorporated herein by reference.

BACKGROUND OF THE INVENTION

1. Field of the Invention

The present invention relates to a wafer level package and a method of manufacturing the same and a method of reusing a chip, and more particularly, to a wafer level package and a method of manufacturing the same and a method of reusing a chip capable of manufacturing the package by selecting only a good chip coated with an epoxy-based photoresist such as KMPR® by MicroChem Corp. (MCC) and reusing the good chip by removing the KMPR® brand photoresist coated on the good chip if necessary after dicing a wafer into the individual packages. KMPR® brand photoresist is high contrast, i-line sensitive and can be developed in conventional aqueous alkaline-based developers and also can be readily removed from the substrate.

2. Description of the Related Art

A conventional package has been manufactured in such a way of cutting a wafer including a plurality of chips along dicing lines to separate the wafer into the individual chips and then performing a packaging process for each chip.

However, the packaging process includes a plurality of unit processes, for example, chip attaching, wire bonding, molding, trimming/forming and the like. Therefore, a conventional package manufacturing method in which the packaging process must be performed for each chip has a problem that it takes too long time to package all the chips in consideration of the number of the chips obtained from one wafer.

Accordingly, recently, there has been proposed a method of manufacturing a package by firstly performing a packaging process in a wafer level state and then dicing a wafer into individual packages. The package manufactured by this method is referred to as a wafer level package.

However, in the conventional wafer level package, since all of good and bad chips are packaged in a wafer level and then diced into the individual packages without selecting and packaging only the good chip, it costs the same as the good chip to package the bad chip in a FAB process. Therefore, there have been problems such as a waste of packaging cost and reduction of production yield.

SUMMARY OF THE INVENTION

The present invention has been proposed in order to solve the above-described problems, and it is, therefore, an object of the present invention to provide a wafer level package and a method of manufacturing the same and a method of reusing a chip capable of improving production yield of the wafer level package and reducing manufacturing cost thereof by selecting only a good chip to manufacture the package and reusing the good chip by removing KMPR® brand photoresist coated on the good chip if necessary.

In accordance with an aspect of the present invention to achieve the object, there is provided a wafer level package including a chip; a removable resin layer formed to surround side surfaces and a lower surface of the chip; a molding material formed on the lower surface of the removable resin layer; a dielectric layer formed over the removable resin layer including the chip and having via holes to expose portions of the chip; redistribution lines formed on the dielectric layer including insides of the via holes to be connected to the chip; and a solder resist layer formed on the dielectric layer to expose portions of the redistribution lines.

Here, the removable resin layer may be made of KMPR® brand photoresist.

Also, the wafer level package may further include a seed layer formed between the dielectric layer and the redistribution lines.

Also, the wafer level package may further include UBMs (Under Bump Metal) and solder balls sequentially formed on the redistribution lines exposed by the solder resist layer.

Also, the chip may be a good chip selected through a chip failure test.

And, in accordance with another aspect of the present invention to achieve the object, there is provided a method of manufacturing a wafer level package including the steps of: separating chips by dicing a wafer; forming a removable resin layer in a space between the separated chips and at upper parts thereof; separating the chips by dicing the removable resin layer; mounting the chips separated in a state of being surrounded by the removable resin layer, on a carrier plate; forming a molding material on the carrier plate to cover the removable resin layer; separating the carrier plate from the chips; forming a dielectric layer having redistribution lines connected to the chips, on the chips exposed by separating the carrier plate; and forming a solder resist layer on the dielectric layer to expose portions of the redistribution lines.

Here, between the step of separating the chips by dicing the wafer and the step of forming the removable resin layer in the space between the separated chips and at the upper parts thereof, the method may further include the step of rearranging the chips to be separated from one another by selecting only the chips determined as good through a chip failure test among the separated chips.

Also, in the step of mounting the chips separated in a state of being surrounded by the removable resin layer, only the chips determined as good through the chip failure test, among the chips separated in a state of being surrounded by the removable resin layer, can be selected to be mounted on the carrier plate on which an adhesion layer is formed.

Also, the removable resin layer may be made of KMPR® brand photoresist.

Also, the step of forming the dielectric layer including the redistribution lines connected to the chips, on the chips exposed by separating the carrier plate may include the steps of: forming the dielectric layer on the chips exposed by separating the carrier plate; forming via holes to expose portions of the chips by removing portions of the dielectric layer; forming a seed layer on the dielectric layer including insides of the via holes; forming a photoresist pattern on the seed layer to expose portions corresponding to the via holes; forming the redistribution lines by plating metal on the seed layer exposed by the photoresist pattern; removing the photoresist pattern; and removing portions of the seed layer exposed by removing the photoresist pattern.

Also, after the step of forming the solder resist layer on the dielectric layer to expose the portions of the redistribution lines, the method may further include the steps of: forming UBMs on the redistribution lines exposed by the solder resist layer; and forming solder balls on the UBMs.

Also, after the step of forming the solder balls, the method may further include the step of separating the chips into individual packages by cutting along dicing lines between the chips.

And, in accordance with still another aspect of the present invention to achieve the object, there is provided a method of reusing a chip including the steps of: manufacturing an individual package by using a method of manufacturing a wafer level package; separating a molding material from a chip by removing a removable resin layer surrounding the chip; and removing a solder resist layer and a dielectric layer including redistribution lines on the chip.

Here, the removable resin layer may be made of KMPR® brand photoresist.

Also, in the step of separating the molding material from the chip by removing the removable resin layer surrounding the chip, the removable resin layer can be removed by using NMP (N-Methyl Pyrrolidone).

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a cross-sectional view illustrating a structure of a wafer level package in accordance with an embodiment of the present invention;

FIGS. 2 to 20 are plan views and cross-sectional views sequentially illustrating a method of manufacturing a wafer level package in accordance with another embodiment of the present invention; and FIGS. 21 to 22 are cross-sectional views illustrating a method of reusing a chip in accordance with still another embodiment of the present invention.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

First, a wafer level package in accordance with an embodiment of the present invention will be described in detail with reference to FIG. 1.

FIG. 1 is a cross-sectional view illustrating a structure of the wafer level package in accordance with the embodiment of the present invention.

As shown in FIG. 1, the wafer level package in accordance with the embodiment of the present invention includes a chip 10, a removable resin layer 20 formed to surround side surfaces and a lower surface of the chip 10, a molding material 32 formed on the lower surface of the removable resin layer 20, a dielectric layer 33 formed over the removable resin layer 20 including the chip 10 and having via holes 34 to expose portions of the chip 10, redistribution lines 37 formed on the dielectric layer 33 including insides of the via holes 34 to be connected to the chip 10, and a solder resist layer 38 formed on the dielectric layer 33 to expose portions of the redistribution lines 37.

Here, the chip 10 is a good chip selected through a chip failure test.

That is, the wafer level package in accordance with the embodiment of the present invention is packaged by using only the chip determined as good without using the chip determined as bad through the chip failure test of the chips separated through dicing of a wafer.

The removable resin layer 20 surrounding the chip 10 may be made of resin such as KMPR® brand photoresist and the like, which is removable without damage to an adhered surface. The KMPR® brand photoresist can be cleanly removed without damage to the adhered surface by NMP (N-Methyl Pyrrolidone) and the like.

The molding material 32 formed on the lower surface of the removable resin layer 20 may be made of EMC (Epoxy Molding Compound) and the like.

A seed layer 35 is formed between the dielectric layer 33 and the redistribution lines 37. The seed layer 35 may be formed by Cu electroless plating and the like.

Also, the redistribution lines 37 may be formed on the seed layer 35 by Cu electro plating and the like.

UBMs (Under Bump Metal) 39 are formed on the redistribution lines 37 exposed by the solder resist layer 38, and solder balls 40 are formed on the UBMs 39.

Hereinafter, a method of manufacturing a wafer level package shown in FIG. 1 in accordance with another embodiment of the present invention will be described in detail with reference to FIGS. 2 to 20.

FIGS. 2 to 20 are plan views and cross-sectional views sequentially illustrating the method of manufacturing the wafer level package in accordance with the embodiment of the present invention.

First, as shown in FIGS. 2 and 3, chips 10 are separated by dicing a wafer 100.

Then, as shown in FIG. 4, a removable resin layer 20 is formed in a space between the separated chips 10 and at upper parts thereof and then cured.

Here, the removable resin layer 20 may be made of KMPR® brand photoresist and the like, and the KMPR® brand photoresist is formed by a method such as spin coating and the like. As described above, the KMPR® brand photoresist has an advantage of being removed without damage to an adhered surface.

Next, as shown in FIG. 5, the chips 10 are separated by dicing the removable resin layer 20.

After that, as shown in FIG. 6, a carrier plate 30 is prepared. The carrier plate 30 may be made of porous ceramic and the like.

Then, as shown in FIG. 7, an adhesion layer 31 is formed on the carrier plate 30.

Next, as shown in FIG. 8, the chips 10, which are separated in a state of being surrounded by the removable resin layer 20, are mounted on the carrier plate 30 on which the adhesion layer 31 is formed.

Here, when mounting the chips 10, it is preferable to select and mount only the chips determined as good through a chip failure test, among the chips 30 separated in a state of being surrounded by the removable resin layer 20.

Also, in the embodiment of the present invention, in order to mount only the good chips on the carrier plate 30, instead of selecting and mounting only the good chips when mounting the chips 10 on the carrier plate 30 as described above, the chips 10 are separated by dicing the wafer 100 as shown in FIG. 1, and then the removable resin layer 20 may be formed in the space between the rearranged good chips 10 and at the upper parts thereof after selecting only the chips determined as good through the chip failure test among the separated chips 10 and rearranging the selected chips to be separated from one another. In this case, as shown in FIG. 5, since all of the chips 10, which are diced in a state of being surrounded by the removable resin layer 20, may be the good chips, all of the chips 10 surrounded by the removable resin layer 20 can be mounted on the carrier plate 30. Therefore, there is an advantage of reducing material cost of the removable resin layer 20.

After that, as shown in FIG. 9, a molding material 32 is formed on the adhesion layer 31 to cover the removable resin layer 20. The molding material 32 may be made of EMC and the like.

Next, as shown in FIG. 10, the carrier plate 30 is separated from the chips 10 by dipping the porous ceramic carrier plate 30 in an organic solvent such as acetone and the like so that the organic solvent is absorbed through the porous ceramic carrier plate 30 to melt the adhesion layer 31 on the carrier plate 30.

Then, as shown in FIG. 11, a dielectric layer 33 is formed on the molding material 32 and the removable resin layer 20 including the chips 10 exposed by separating the carrier plate 30.

Next, as shown in FIG. 12, via holes 34 are formed to expose portions of the chips 10 by removing portions of the dielectric layer 33.

Next, as shown in FIG. 13, a seed layer 35 is formed on the dielectric layer 33 including insides of the via holes 34 by Cu electroless plating and the like.

After that, as shown in FIG. 14, a photoresist pattern 36 is formed on the seed layer 35 to expose portions corresponding to the via holes 34. The photoresist pattern 36 plays a role of a plating mask when plating redistribution lines 37 described later.

Then, as shown in FIG. 15, the redistribution lines 37 are formed by plating metal on the seed layer 35 exposed by the photoresist pattern 36. The redistribution lines 37 may be formed by Cu electro plating and the like.

Next, as shown in FIG. 16, the photoresist pattern 36 is removed.

Next, as shown in FIG. 17, portions of the seed layer 35, which are exposed by removing the photoresist pattern 36, are removed by etching.

Then, as shown in FIG. 18, portions of the redistribution lines 37 are exposed by removing portions of a solder resist layer 38 after forming the solder resist layer 38 on the dielectric layer 33.

After that, as shown in FIG. 19, solder balls 40 are formed on UBMs 39 after forming the UBMs 39 on the redistribution lines 37 exposed by the solder resist layer 38.

Then, as shown in FIG. 20, the chips 10 are separated into individual packages by cutting along dicing lines therebetween.

As described above, the method of manufacturing the wafer level package in accordance with the embodiment of the present invention has effects of improving production yield of the wafer level package and reducing manufacturing cost thereof by selecting only the good chips 10 to manufacture the wafer level package.

The method of manufacturing the wafer level package in accordance with the embodiment of the present invention can be applied to fan-out type wafer level packaging as well as chip size wafer level packaging.

Hereinafter, a method of reusing a chip in accordance with still another embodiment of the present invention will be described in detail with reference to FIGS. 21 and 22.

FIGS. 21 and 22 are cross-sectional views illustrating the method of reusing the chip in accordance with the embodiment of the present invention.

First, as shown in FIGS. 2 to 20, individual packages are manufactured by a method of manufacturing a wafer level package in accordance with another embodiment of the present invention.

All of the individual packages of the wafer level package in accordance with the embodiment of the present invention include good chips 10.

However, even in case of the package manufactured by the good chip 10, a package failure can be generated since the failure is generated in a build-up process of forming redistribution lines 37 and the like on the chip 10.

In this case, since the chip 10 itself is a good chip, in case of separating and reusing only the chip 10, there is an advantage of saving process cost and the like for manufacturing the good chip 10.

For this, in the embodiment of the present invention, as shown in FIG. 21, a molding material 32 is separated from the chip 10 by removing a removable resin layer 20 surrounding the chip 10 after manufacturing the individual package.

At this time, as described above, since the removable resin layer 20 surrounding the chip 10 is made of resin such as KMPR® brand photoresist and the like, which is removable without damage to an adhered surface, the molding material 32 can be removed without damage to a surface of the chip 10 through removal of the resin layer 20.

The removable resin layer 20 can be removed by NMP and the like.

Then, as shown in FIG. 22, a solder resist layer 38 and a dielectric layer 33 including the redistribution lines 37 on the chip 10 are all removed. The dielectric layer 33 and the solder resist layer 38 can be removed by plasma etching and the like, and the redistribution lines 37 can be removed by a Cu etchant and the like.

As described above, the wafer level package and the method of manufacturing the same and the method of reusing the chip in accordance with the present invention have effects of improving production yield of the wafer level package and reducing manufacturing cost thereof by selecting only the good chip to manufacture the wafer level package.

Also, the present invention has an advantage of reusing the good chip if necessary by separating the molding material from the good chip through removal of the removable resin layer surrounding the good chip.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A wafer level package comprising:
    a chip;
    a removable resin layer formed to surround side surfaces and a lower surface of the chip, the chip being re-used by being easily removed from the removable resin layer, the removable resin layer being made of a high contrast, i-line sensitive epoxy-based photoresist that is developed in an aqueous alkaline-based developer;
    a molding material formed on a lower surface of the removable resin layer;
    a dielectric layer formed over the removable resin layer including the chip and including via holes to expose portions of the chip;

a plurality of redistribution lines formed on the dielectric layer including insides of the via holes to be connected to the chip; and a solder resist layer formed on the dielectric layer to expose portions of the redistribution lines.

2. The wafer level package according to claim 1, further comprising:

a seed layer formed between the dielectric layer and the redistribution lines.

3. The wafer level package according to claim 1, further comprising:

Under Bump Metal (UBMs) and solder balls sequentially formed on the redistribution lines exposed by the solder resist layer.

4. The wafer level package according to claim 1, wherein the chip is a good chip selected through a chip failure test.

* * * * *